(12) United States Patent
Furuya

(10) Patent No.: US 7,603,579 B2
(45) Date of Patent: Oct. 13, 2009

(54) SEMICONDUCTOR CHIP AND SEMICONDUCTOR INTEGRATED CIRCUIT DEVICE FOR RELAYING A REFERENCE CLOCK FROM ONE HARD MACRO TO ANOTHER

(75) Inventor: Nobuo Furuya, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 507 days.

(21) Appl. No.: 11/411,108

(22) Filed: Apr. 26, 2006

(65) Prior Publication Data
US 2007/0011532 A1    Jan. 11, 2007

(30) Foreign Application Priority Data
May 10, 2005    (JP)    ............... 2005-137413

(51) Int. Cl.
G06F 1/00    (2006.01)
G06F 1/04    (2006.01)
G06F 1/12    (2006.01)
G06F 17/50    (2006.01)

(52) U.S. Cl. ............... 713/600; 713/500; 716/1
(58) Field of Classification Search ......... 713/500, 713/600; 716/1, 12
See application file for complete search history.

(56) References Cited

U.S. PATENT DOCUMENTS 5,774,371 A * 6/1998 Kawakami ............... 716/10
6,611,920 B1 * 8/2003 Fletcher et al. ........... 713/322

FOREIGN PATENT DOCUMENTS

JP    11-204649    7/1999
JP    2000-269349    9/2000

* cited by examiner

*Primary Examiner*—Mark Connolly
(74) *Attorney, Agent, or Firm*—McGinn IP Law Group, PLLC

(57) ABSTRACT

A semiconductor chip has: a plurality of hard macros which operates based on a reference clock; and a clock pad through which the reference clock is supplied from the outside to one of the plurality of hard macros. The reference clock supplied to the one hard macro is relayed to other hard macros of the plurality of hard macros in order.

18 Claims, 6 Drawing Sheets

SEMICONDUCTOR CHIP AND SEMICONDUCTOR INTEGRATED CIRCUIT DEVICE FOR RELAYING A REFERENCE CLOCK FROM ONE HARD MACRO TO ANOTHER

BACKGROUND OF THE INVENTION

1. Field of the Invention

The present invention relates to a semiconductor chip and a semiconductor integrated circuit device. Particularly, the present invention relates to a technique of clock supplying in a semiconductor chip and a semiconductor integrated circuit device.

2. Description of the Related Art

Demand for a high-performance computer server and a high-performance network device is increasing so as to realize a next-generation broadband network which serves as a foundation for an advanced IT society. It is essential for the high-performance computer server and the high-performance network device to execute high-speed transfer of data between LSIs. As a high-speed communication method, a serial communication method has become mainstream, in which one transmission line is used for transmitting data so as to avoid the burden of controlling the timing between data.

In the serial communication, a device for converting parallel data to serial bit stream and a device for executing the inverse conversion are necessary. Such devices executing the serial-parallel conversion are called serializer/deserializer (SerDes). In a semiconductor chip (LSI chip) which executes the high-speed serial communication, the SerDes hard macro is provided in the chip, and serial communication at a bit rate of, for example, several Gbit/s is realized. A plurality of SerDes hard macros, for example, 16 SerDes hard macros may be installed in one semiconductor chip.

FIG. 1 schematically shows a configuration of a conventional semiconductor chip 101. In the semiconductor chip 101 shown in FIG. 1, a plurality of SerDes hard macros 102 are provided next to four sides of the chip. Each SerDes hard macro 102 has an external input buffer 104 and a PLL (Phase Lock Loop) circuit 103. A reference clock CLK is input to the external input buffer 104 from outside the chip, and the PLL circuit 103 multiplies the input reference clock CLK. As a result of the multiplication of the reference clock CLK, the PLL circuit 103 generates a high-speed clock used for sending and receiving the serial data and outputs the high-speed clock to the serializer and the deserializer.

It is necessary for maintaining quality of the high-speed data communication to stabilize the high-speed clock generated by the PLL circuit 103. The high-speed clock characteristics are dependent on the characteristics of the reference clock CLK supplied from the external input buffer 104 to the PLL circuit 103. If noises and jitters are mixed into the reference clock CLK, reliability of the data communication deteriorates due to the increase in error rate. It is therefore necessary to determine a layout of the semiconductor chip 101 such that the reference clock CLK is prevented from influences of the noises in the semiconductor chip 101.

For example, a power supply line and a ground line of the SerDes hard macro 102 are isolated from a power supply line and a ground line of another logic circuit, respectively, on the semiconductor chip 101. The external input buffer 104 is placed in the SerDes hard macro 102, and a power supply line and a ground line of the external input buffer 104 are isolated from a power supply line and ground line of another logic circuit. As a result, the reference clock CLK in the SerDes hard macro 102 is prevented from being affected by the noises on the power supply line and the ground line of the other logic circuit in the semiconductor chip 101.

The followings are known as conventional techniques with regard to the clock supplying in a semiconductor integrated circuit.

Japanese Laid Open Patent Application (JP-A-Heisei, 11-204649) discloses a semiconductor integrated circuit. The semiconductor integrated circuit is provided with a special power supply line which supplies power source specially for clock buffer cells distributing a clock signal to internal circuits in a chip. A part of or all the clock buffer cells are placed on the peripheral section of the chip where input-output circuits which serve as interfaces between the internal circuits and the outside are arranged. The special power supply line is arranged over the input-output circuits and the clock buffer cells which are placed on the peripheral section of the chip.

Japanese Laid Open Patent Application (JP-P2000-269349A) discloses a macro block. The macro block has at least one clock input terminal on its each side. The macro block is provided with a selection circuit, to whose input terminal a plurality of signal interconnections connected to respective of a plurality of clock input terminals is connected. An output terminal of the selection circuit is connected to input terminals of circuit elements to which clock signals are distributed. Clock signals supplied through selected clock input terminals out of the plurality of clock input terminals are selectively distributed to the circuit elements through the selection circuit.

SUMMARY OF THE INVENTION

The present invention has recognized the following points. FIG. 2 schematically shows a configuration of a semiconductor integrated circuit device which has the conventional semiconductor chip 101 shown in FIG. 1. The above-mentioned semiconductor chip 101 is encapsulated in a package 110, and the package 110 is mounted on a board. An input of the external input buffer 104 of the SerDes hard macro 102 is connected to any of package pins 111 through an I/O pad of the chip. The package pins 111 used for supplying the reference clock CLK to the SerDes hard macro 102 are connected to a clock driver IC 113 through reference clock wirings 112.

Here, the semiconductor chip 101 shown in FIG. 1 has four SerDes hard macros 102, and four package pins 111 are necessary for inputting the reference clock CLK to the semiconductor chip 101. Thus, four reference clock wirings 112 are necessary on the board in order to connect between the clock driver IC 113 and respective of the four package pins 111. As described above, it is necessary according to the conventional technique to provide the plurality of reference clock wirings 112 on the board, although the reference clock signal of the same frequency is merely supplied to the same semiconductor chip 101.

In an aspect of the present invention, a semiconductor chip has: a plurality of hard macros which operates on the basis of a reference clock; and a clock pad through which the reference clock is supplied from the outside to one of the plurality of hard macros. The reference clock supplied to the one hard macro is relayed to other hard macros of the plurality of hard macros in order.

Therefore, when a package in which the semiconductor chip is encapsulated is mounted on a board, only one package pin is sufficient to input the reference clock into the semiconductor chip. The one package pin is connected to a clock pad of the semiconductor chip. The reference clock is supplied from one reference clock wiring on the board to the above-mentioned one hard macro through the one package pin and the clock pad. As described above, it is possible according to the present invention to reduce the number of reference clock wirings on the board even when the plurality of hard macros are provided in one semiconductor chip. Thus, routing performance is improved, and interconnection capacity is reduced.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

FIRST EMBODIMENT

Circuit Configuration

Figure 1:
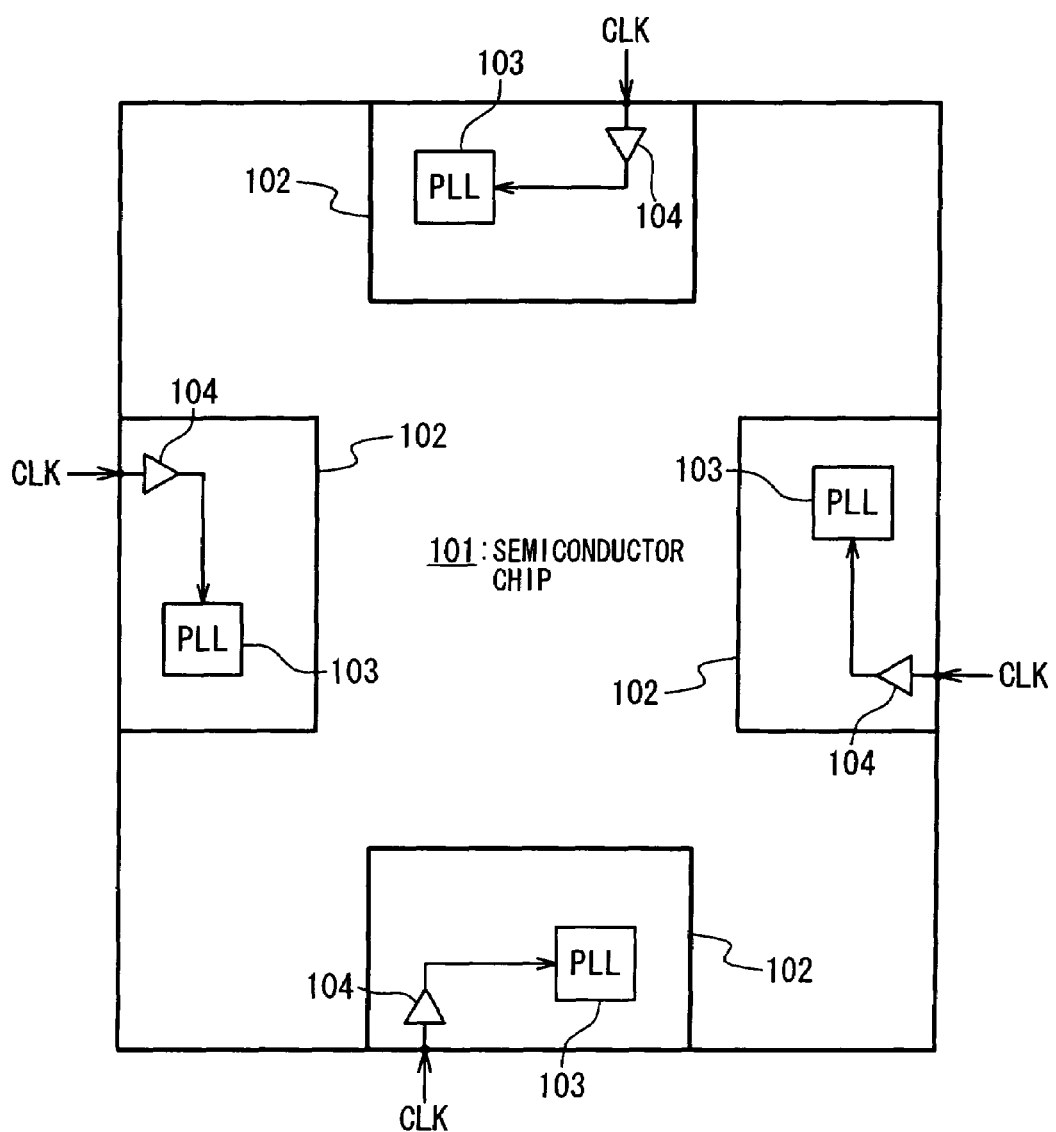
FIG. 1 is a circuit block diagram schematically showing a configuration of a conventional semiconductor chip.
Figure 2:
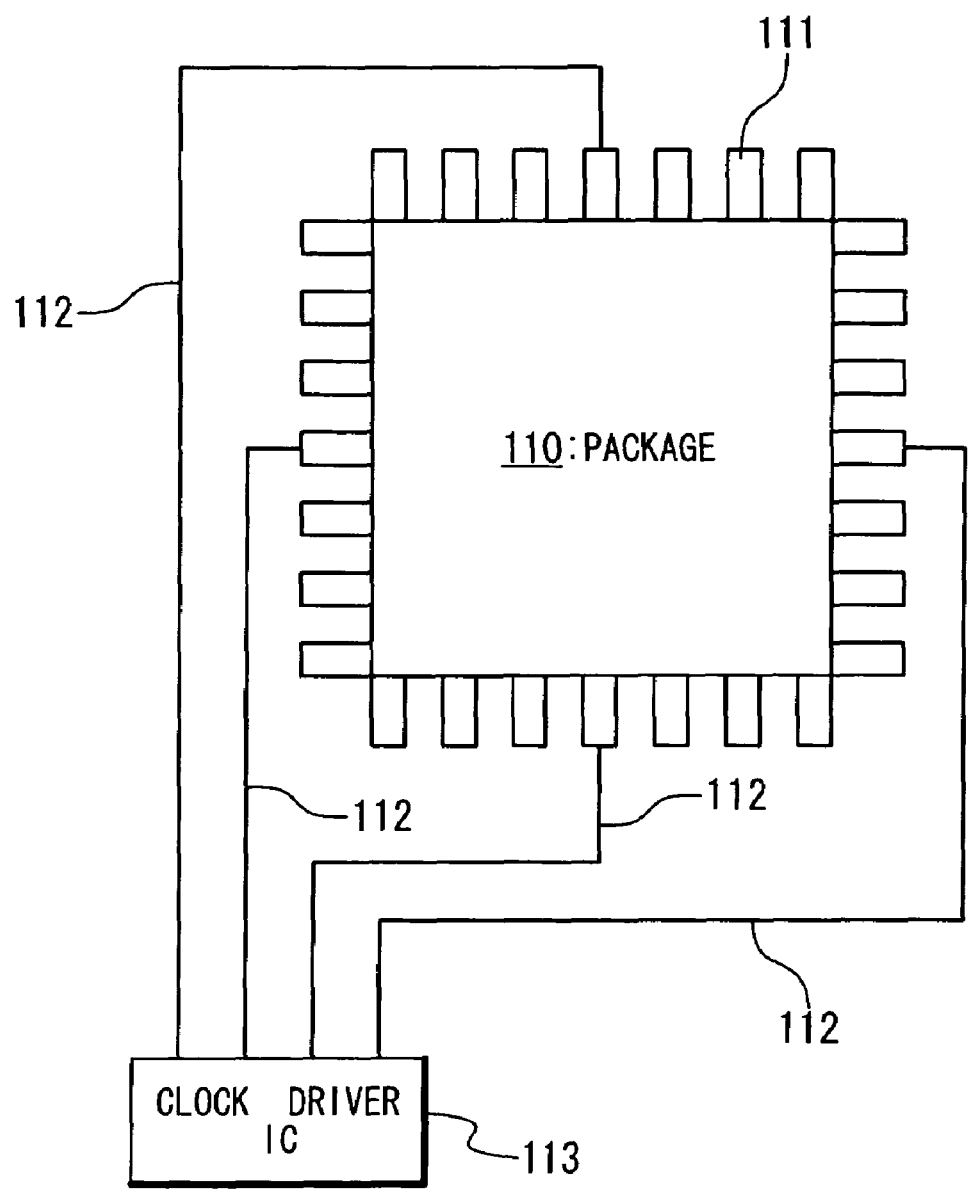
FIG. 2 is a block diagram schematically showing a configuration of a conventional semiconductor integrated circuit device including the semiconductor chip shown in FIG. 1.
Figure 3:
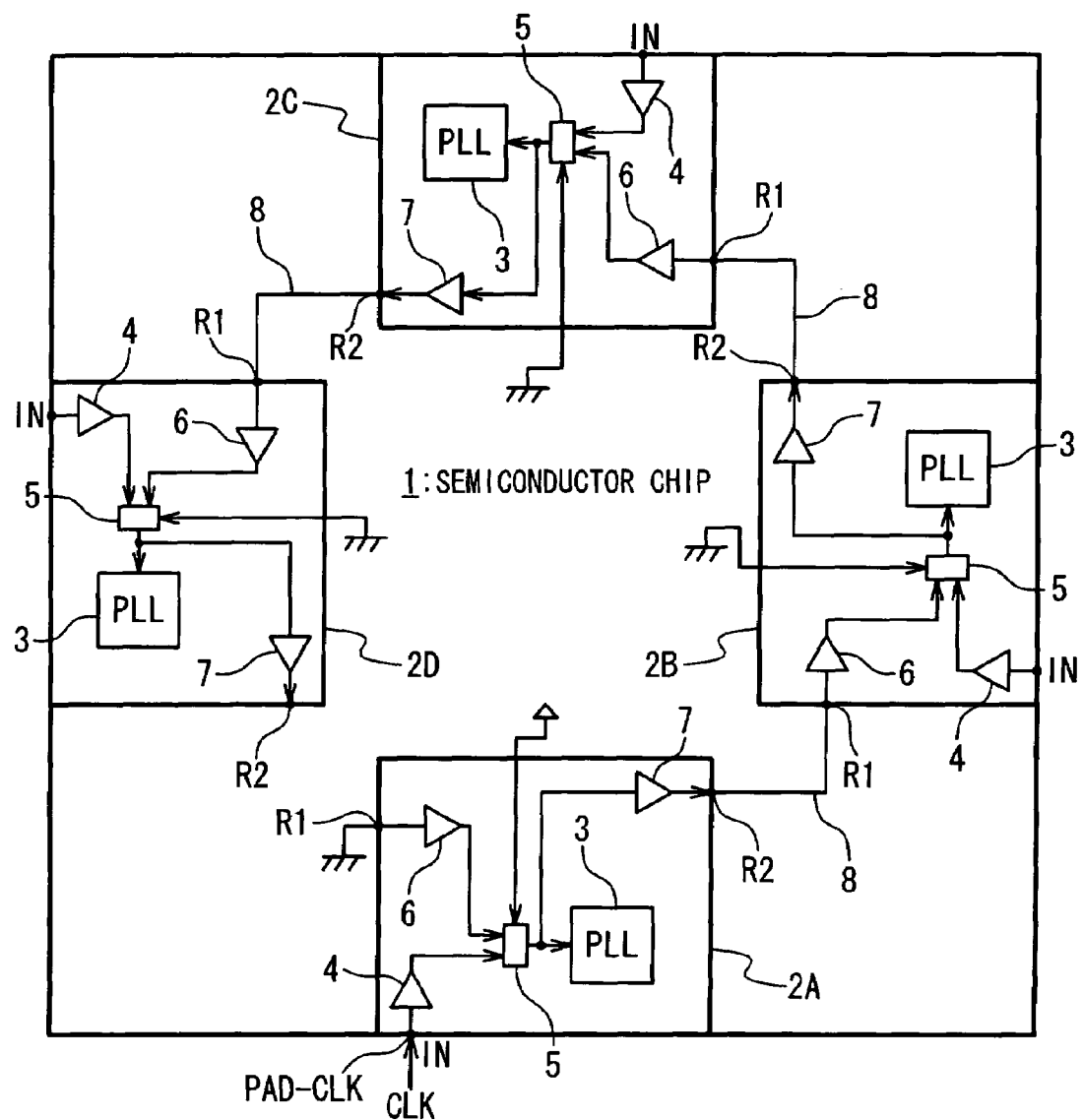
FIG. 3 is a circuit block diagram schematically showing a configuration of a semiconductor chip according to a first embodiment of the present invention.

FIG. 3 is a circuit block diagram schematically showing a configuration of a semiconductor chip 1 according to a first embodiment of the present invention. In the semiconductor chip 1 shown in FIG. 3, a plurality of hard macros 2A to 2D are provided next to four sides of the chip, respectively.

Each of the hard macros 2A to 2D is configured to operate on the basis of a reference clock CLK that is supplied to the semiconductor chip 1 from the outside. More particularly, each hard macro 2 includes a PLL circuit 3 which multiplies the input reference clock CLK to generate a high-speed clock. The high-speed clock generated by the PLL circuit 3 is supplied to a signal processing circuit (not shown). The signal processing circuit performs a predetermined operation on the basis of the high-speed clock.

For example, each hard macro 2 is a serializer/deserializer (SerDes) macro for executing serial-parallel conversion of data. In this case, the PLL circuit 3 outputs the high-speed clock produced from the reference clock CLK to the serializer and the deserializer. The semiconductor chip 1 serves as an LSI chip for the high-speed serial communication.

Each hard macro 2 is provided with a clock input terminal IN, a relay input terminal R1 and a relay output terminal R2. The clock input terminal IN is a terminal for receiving the reference clock CLK from the outside of the semiconductor chip 1. The relay input terminal R1 is a terminal for receiving the reference clock CLK which is relayed from another hard macro 2, as described later. The relay output terminal R2 is a terminal for transferring the reference clock CLK to another hard macro 2, as described later. In FIG. 3, respective of the relay input terminal R1 and the relay output terminal R2 are provided on two sides of the hard macro 2, wherein the two sides face each other.

Also, each hard macro 2 has an external input buffer 4, a relay input buffer 6, a relay output buffer 7 and a selector 5. The selector 5 is connected to the external input buffer 4, the relay input buffer 6, the relay output buffer 7 and the PLL circuit 3. An input of the external input buffer 4 is connected to the clock input terminal IN. When receiving the reference clock CLK from the outside, the external input buffer 4 outputs the received reference clock CLK to the selector 5. An input of the relay input buffer 6 is connected to the relay input terminal R1. When receiving the reference clock CLK from another hard macro 2, the relay input buffer 6 outputs the received reference clock CLK to the selector 5. The selector 5 selects any of the external input buffer 4 and the relay input buffer 6 as a "selected input buffer". The selector 5 receives the reference clock CLK from the selected input buffer, and outputs the received reference clock CLK to the PLL circuit 3 and the relay output buffer 7. An output of the relay output buffer 7 is connected to the relay output terminal R2. When receiving the reference clock CLK from the selector 5, the relay output buffer 7 outputs the received reference clock CLK to the relay output terminal R2.

On the semiconductor chip 1 shown in FIG. 3, the plurality of hard macros 2A to 2D are connected in series one after another through a relay interconnection 8. More specifically, the relay output terminal R2 of the hard macro 2A is connected to the relay input terminal R1 of the hard macro 2B through the relay interconnection 8. The relay output terminal R2 of the hard macro 2B is connected to the relay input terminal R1 of the hard macro 2C through the relay interconnection 8. Moreover, the relay output terminal R2 of the hard macro 2C is connected to the relay input terminal R1 of the hard macro 2D through the relay interconnection 8. The relay interconnection 8 is a special (specific) interconnection used only for relaying the reference clock CLK from a hard macro 2 to another hard macro 2.

Furthermore, the semiconductor chip 1 is provided with a clock pad PAD-CLK which is used for receiving the reference clock CLK supplied from the outside. The clock pad PAD-CLK is connected to the clock input terminal IN (the external input buffer 4) of the hard macro 2A. As a result, the reference clock CLK is supplied to the hard macro 2A among the plurality of hard macros 2 through the clock pad PAD-CLK from the outside the semiconductor chip 1. The clock input terminals IN of the other hard macros 2B to 2D are not connected to the clock pad PAD-CLK.

It should be noted that, on the semiconductor chip 1, power supply lines and ground lines for the plurality of hard macros 2A to 2D are isolated from a power supply line and a ground line for another logic circuit, respectively. The external input buffer 4, the selector 5, the relay input buffer 6 and the relay output buffer 7 are placed in each hard macro 2, and power supply lines and ground lines thereof are isolated from a power supply line and a ground line for another logic circuit. As a result, the reference clock CLK in each hard macro 2 is prevented from being affected by the noises on the power supply line and the ground line of the other logic circuit in the semiconductor chip 1.

Operation

In the semiconductor chip 1 having the above-mentioned configuration, the selector 5 is set as follows. The selector 5 of the hard macro 2A is controlled on the chip to select the external input buffer 4 as the selected input buffer. On the other hand, the selectors 5 of the hard macros 2B to 2D are controlled on the chip to select the relay input buffer 6 as the selected input buffer. Thus, the external input buffers 4 of the hard macros 2B to 2D are not used. In this case, the semiconductor chip 1 operates as follows.

First, the reference clock CLK is supplied to the clock input terminal IN of the hard macro 2A through the clock pad PAD-CLK from the outside the chip. In the hard macro 2A, the external input buffer 4 receives the reference clock CLK from the clock input terminal IN, and outputs the reference clock CLK to the selector 5. The selector 5 outputs the reference clock CLK supplied from the external input buffer 4 to the PLL circuit 3 and the relay output buffer 7. The relay output buffer 7 outputs the received reference clock CLK to the relay output terminal R2.

The reference clock CLK output from the relay output terminal R2 of the hard macro 2A is relayed to the relay input terminal R1 of the hard macro 2B through the relay interconnection 8. In the hard macro 2B, the relay input buffer 6 receives the reference clock CLK from the relay input terminal R1 and outputs the reference clock CLK to the selector 5. The selector 5 outputs the reference clock CLK supplied from the relay input buffer 6 to the PLL circuit 3 and the relay output buffer 7. The relay output buffer 7 outputs the received reference clock CLK to the relay output terminal R2.

Similarly, the reference clock CLK output from the relay output terminal R2 of the hard macro 2B is relayed to the relay input terminal R1 of the hard macro 2C through the relay interconnection 8. The reference clock CLK output from the relay output terminal R2 of the hard macro 2C is relayed to the relay input terminal R1 of the hard macro 2D through the relay interconnection 8. In this manner, according to the present embodiment, the reference clock CLK is transferred to the hard macros 2A, 2B, 2C and 2D in order through the relay interconnection 8. That is, according to the present embodiment, the reference clock CLK supplied from the clock pad PAD-CLK to the one hard macro 2A is relayed to the other hard macros 2B, 2C and 2D in order. It is preferable that the relay interconnection 8 is a special interconnection used only for relaying the reference clock CLK so that the influences due to other signals are suppressed.

Effect

Figure 4:
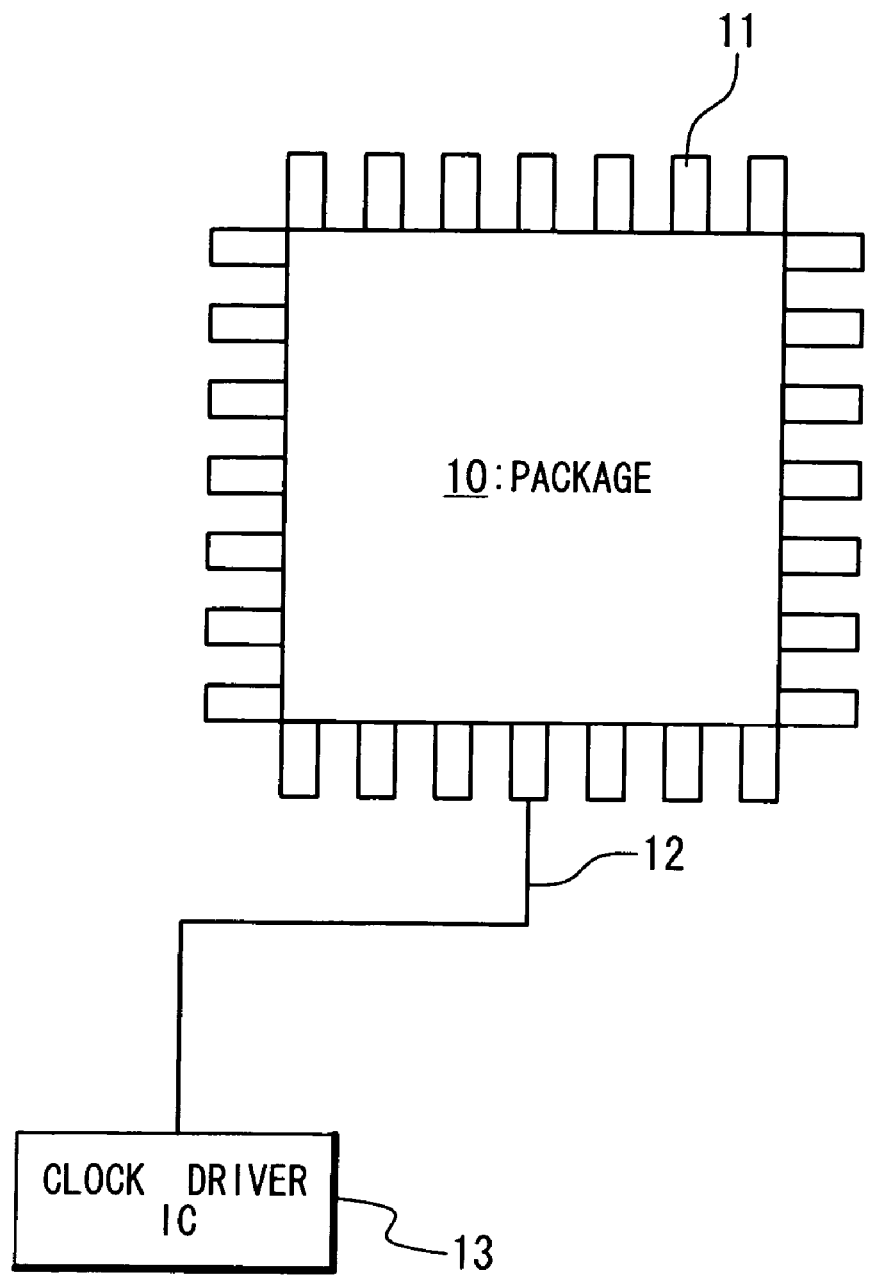
FIG. 4 is a block diagram schematically showing a configuration of a semiconductor integrated circuit device including the semiconductor chip according to the embodiment of the present invention.

FIG. 4 schematically shows a configuration of a semiconductor integrated circuit device which has the semiconductor chip 1 shown in FIG. 3. The above-mentioned semiconductor chip 1 is encapsulated in a package 10, and the package 10 is mounted on a board. The clock pad PAD-CLK is connected to any of package pins 11. The one package pin 11 is connected to a clock driver IC 13 through one reference clock wiring 12. The clock driver IC 13 supplies the reference clock CLK through the one reference clock wiring 12 to the clock pad PAD-CLK of the semiconductor chip 1. In the semiconductor chip 1, the reference clock CLK is relayed to the plurality of hard macros 2 in order. According to the present embodiment, as described above, only one package pin 11 is sufficient to input the reference clock CLK into the semiconductor chip 1. Also, the one reference clock wiring 12 provided on the board is sufficient for the clock supplying. It is thus possible to reduce the number of reference clock wirings 12 on the board even when the plurality of hard macros 2 are provided in one semiconductor chip 1. Therefore, routing performance is improved, and interconnection capacity is reduced.

Preferably, the power supply line and the ground line for the hard macro 2 is isolated on the chip from a power supply line and a ground line for another logic circuit, respectively. It is also preferable that the plurality of hard macros 2 are connected one after another through the special interconnection 8 which is used only for the relay of the reference clock CLK. As a result, the reference clock CLK is prevented from being affected by the noises on the power supply line and the ground line for the other logic circuit in the semiconductor chip 1. In particular, such a configuration is preferable in a case when the hard macro 2 has the PLL circuit 3 which multiplies the reference clock CLK and supplies the high-speed clock to a signal processing circuit. The reason is that the high-speed clock stabilizes when the reference clock CLK is not influenced by the noises, and hence an operation of the signal processing circuit based on the high-speed clock is also stabilized. For example, when the hard macro 2 is a SerDes macro, the serial communication with high reliability and high quality can be realized by the configuration of the present embodiment.

SECOND EMBODIMENT

Circuit Configuration

Figure 5:
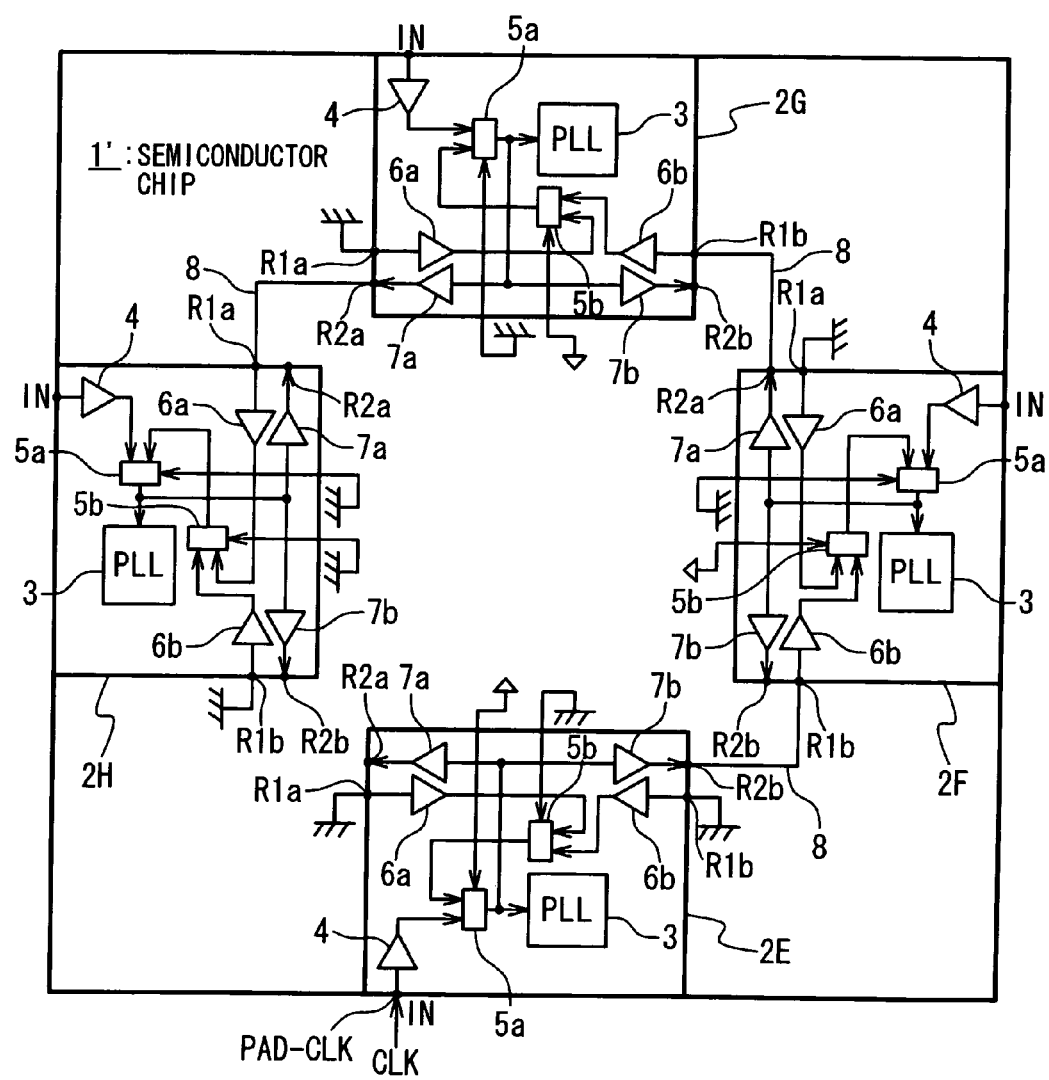
FIG. 5 is a circuit block diagram schematically showing a configuration of a semiconductor chip according to a second embodiment of the present invention.

FIG. 5 is a circuit block diagram schematically showing a configuration of a semiconductor chip 1' according to a second embodiment of the present invention. In FIG. 5, the same reference numerals are given to the same components as those described in the first embodiment, and the redundant description will be appropriately omitted. In the semiconductor chip 1' shown in FIG. 5, a plurality of hard macros 2E to 2H are provided next to four sides of the semiconductor chip 1', respectively.

Each hard macro 2 is provided with a clock input terminal IN, a first relay input terminal R1a, a second relay input terminal R1b, a first relay output terminal R2a and a second relay output terminal R2b. The first relay input terminal R1a and the first relay output terminal R2a are provided on the same side (a first side) of the hard macro 2. The second relay input terminal R1b and the second relay output terminal R2b are provided on the same side (a second side) of the hard macro 2. In FIG. 5, the first side and the second side face each other. In that case, the first relay input terminal R1a and the second relay input terminal R1b are provided to face each other. Also, the first relay output terminal R2a and the second relay output terminal R2b are provided to face each other.

Each hard macro 2 includes the external input buffer 4, a first relay input buffer 6a, a second relay input buffer 6b, a first relay output buffer 7a, a second relay output buffer 7b, a selector 5a and a selector 5b. The input of the external input buffer 4 is connected to the clock input terminal IN. When receiving the reference clock CLK from the outside, the external input buffer 4 outputs the received reference clock CLK to the selector 5a. An input of the first relay input buffer 6a is connected to the first relay input terminal R1a. An input of the second relay input buffer 6b is connected to the second relay input terminal R1b. When receiving the reference clock CLK from another hard macro 2, each of the first and the second relay input buffers 6a and 6b outputs the received reference clock CLK to the selector 5b.

The selector 5b outputs any of outputs of the first relay input buffer 6a and the second relay input buffer 6b to the selector 5a. The selector 5a selects any of outputs of the external input buffer 4 and the selector 5b. That is to say, any of the external input buffer 4, the first and the second relay input buffers 6a and 6b is selected as a "selected input buffer" by the selectors 5a and 5b. The selector 5a outputs the reference clock CLK supplied from the selected input buffer to the PLL circuit 3, the first and the second relay output buffers 7a and 7b. An output of the first relay output buffer 7a is connected to the first relay output terminal R2a. An output of the second relay output buffer 7b is connected to the second relay output terminal R2b. When receiving the reference clock CLK from the selector 5a, the first and the second relay output buffers 7a and 7b output the reference clock CLK to the first and the second relay output terminals R2a and R2b, respectively.

In the semiconductor chip 1' shown in FIG. 5, the hard macro 2F is arranged to be a mirror image of the hard macro 2E. In other words, location of each element in the macro is reversed between the hard macro 2E and the hard macro 2F. Such the relationship is referred to as a "mirror relationship" hereinafter. There is a mirror relationship between the hard macro 2G and the hard macro 2E. With respect to the hard macro 2H and the hard macro 2E, locations of elements in the macro are the same, and there is no mirror relationship between them. Also, with respect to the hard macro 2F and the hard macro 2G, locations of elements in the macro are the same, and there is no mirror relationship between them.

On the semiconductor chip 1', the plurality of hard macros 2E to 2H are connected in series one after another through the relay interconnection 8. More specifically, the second relay output terminal R2b of the hard macro 2E is connected to the second relay input terminal R1b of the hard macro 2F through the relay interconnection 8. The first relay output terminal R2a of the hard macro 2F is connected to the second relay input terminal R1b of the hard macro 2G through the relay interconnection 8. Moreover, the first relay output terminal R2a of the hard macro 2G is connected to the first relay input terminal R1a of the hard macro 2H through the relay interconnection 8.

The clock input terminal IN (the external input buffer 4) of the hard macro 2E is connected to the clock pad PAD-CLK. As a result, the reference clock CLK is supplied to the hard macro 2E among the plurality of hard macros 2 through the clock pad PAD-CLK from the outside the semiconductor chip 1'. The clock input terminals IN of the other hard macros 2F to 2H are not connected to the clock pad PAD-CLK.

It should be noted that, on the semiconductor chip 1', power supply lines and ground lines for the plurality of hard macros 2E to 2H are isolated from a power supply line and a ground line for another logic circuit, respectively. The external input buffer 4, the selectors 5a and 5b, the relay input buffers 6a and 6b, the relay output buffers 7a and 7b are placed in each hard macro 2, and power supply lines and ground lines thereof are isolated from a power supply line and a ground line for another logic circuit. As a result, the reference clock CLK in each hard macro 2 is prevented from being affected by the noises on the power supply line and the ground line of the other logic circuit in the semiconductor chip 1'.

Operation

In the semiconductor chip 1' having the above-mentioned configuration, the selectors 5a and 5b are set as follows. In the hard macro 2E, the selector 5a is controlled to select the output of the external input buffer 4, and the selector 5b is set to an arbitrary state. In the hard macros 2F and 2G, the selector 5a is controlled to select the output of the selector 5b, and the selector 5b is controlled to select the output of the second relay input buffer 6b. In the hard macro 2H, the selector 5a is controlled to select the output of the selector 5b, and the selector 5b is controlled to select the output of the first relay input buffer 6a. The external input buffers 4 of the hard macros 2F to 2H are not used. In this case, the semiconductor chip 1' operates as follows.

First, the reference clock CLK is supplied to the clock input terminal IN of the hard macro 2E through the clock pad PAD-CLK from the outside. In the hard macro 2E, the external input buffer 4 receives the reference clock CLK from the clock input terminal IN, and outputs the reference clock CLK to the selector 5a. The selector 5a outputs the reference clock CLK supplied from the external input buffer 4 to the PLL circuit 3 and the relay output buffers 7a and 7b. The second relay output buffer 7b outputs the received reference clock CLK to the second relay output terminal R2b.

The reference clock CLK output from the second relay output terminal R2b of the hard macro 2E is relayed to the second relay input terminal R1b of the hard macro 2F through the relay interconnection 8. In the hard macro 2F, the second relay input buffer 6b receives the reference clock CLK from the second relay input terminal R1b and outputs the reference clock CLK to the selector 5b. The selector 5b outputs the received reference clock CLK to the selector 5a. The selector 5a outputs the reference clock CLK supplied from the second relay input buffer 6b to the PLL circuit 3 and the relay output buffers 7a and 7b. The first relay output buffer 7a outputs the received reference clock CLK to the first relay output terminal R2a.

Similarly, the reference clock CLK output from the first relay output terminal R2a of the hard macro 2F is relayed to the second relay input terminal R1b of the hard macro 2G through the relay interconnection 8. The reference clock CLK output from the first relay output terminal R2a of the hard macro 2G is relayed to the first relay input terminal R1a of the hard macro 2H through the relay interconnection 8. In this manner, according to the present embodiment, the reference clock CLK is transferred to the hard macros 2E, 2F, 2G and 2H in order through the relay interconnection 8. That is, according to the present embodiment, the reference clock CLK supplied from the clock pad PAD-CLK to the one hard macro 2E is relayed to the other hard macros 2F, 2G and 2H in order.

Effect

A layout when the above-mentioned semiconductor chip 1' is mounted on a board is similar to the layout shown in FIG. 4. Therefore, according to the present embodiment, the same effects as in the first embodiment can be obtained. That is, it is possible to reduce the number of reference clock wirings 12 on the board even when the plurality of hard macros 2 are provided in one semiconductor chip 1'. Thus, routing performance is improved, and interconnection capacity is reduced.

As an additional effect, it is possible according to the present embodiment to arrange the plurality of hard macros 2 to have the "mirror relationship" in the semiconductor chip 1'. The reason is that the hard macro 2 according to the present embodiment has two relay input terminals R1a and R1b on different sides and two relay output terminals R2a and R2b on different sides, as shown in FIG. 5. As a comparison, let us consider a case where the hard macros 2 in the first embodiment are arranged to have the mirror relationship. In this case, a relay interconnection 8 connecting between the hard macros 2 having the mirror relationship becomes lengthy, and its interconnection length can not be designed to be minimum length. Since the length of the relay interconnection 8 is increased, waveform of the reference clock CLK is rounded. On the other hand, according to the present embodiment, the plurality of relay input terminals R1 and the plurality of relay output terminals R2 are provided. Therefore, the mirror arrangement is possible without increasing the length of the relay interconnection 8. As a result, the waveform rounding of the reference clock CLK is prevented. In order to reduce the length of the relay interconnection 8, it is preferable that the plurality of relay input terminals R1 and the plurality of relay output terminals R2 are provided on the opposite sides, as shown in FIG. 5.

THIRD EMBODIMENT

Circuit Configuration

Figure 6:
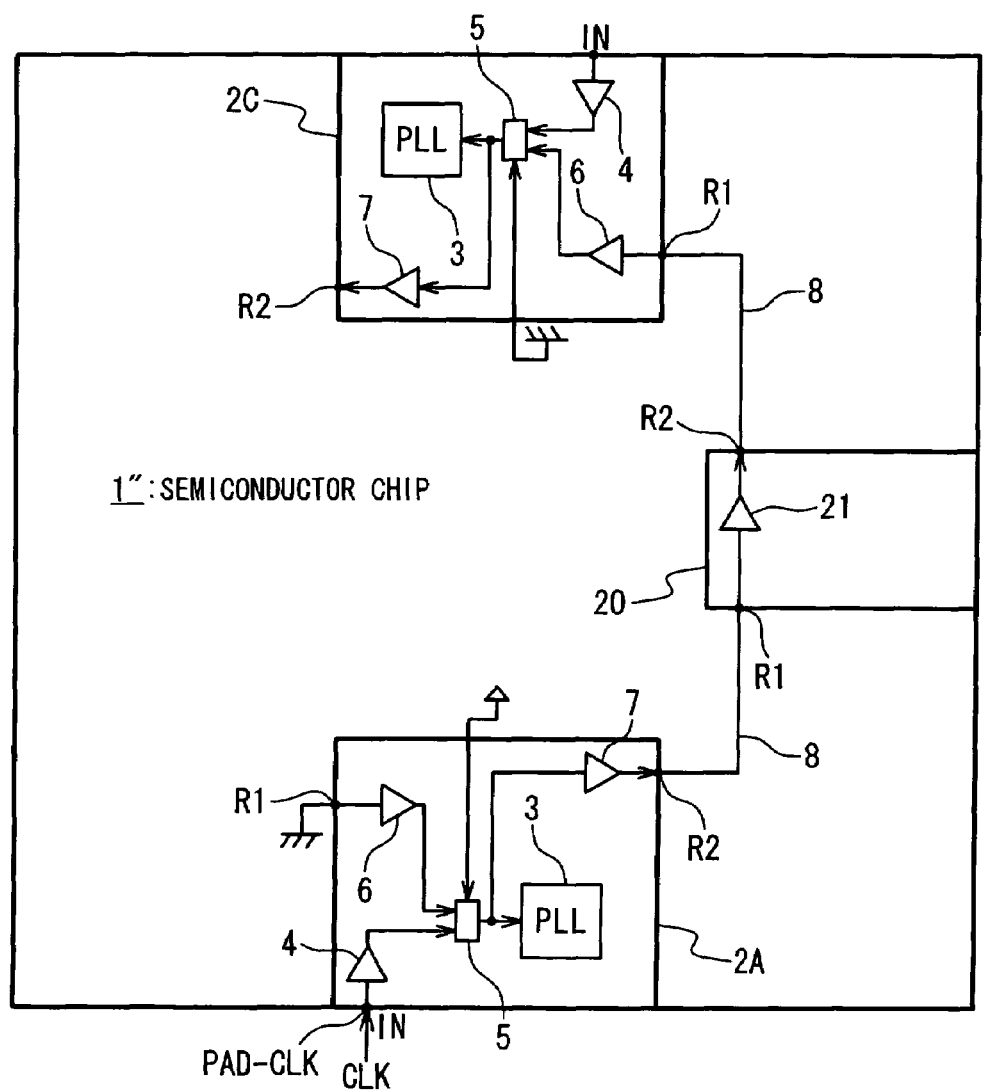
FIG. 6 is a circuit block diagram schematically showing a configuration of a semiconductor chip according to a third embodiment of the present invention.

FIG. 6 is a circuit block diagram schematically showing a configuration of a semiconductor chip 1" according to a third embodiment of the present invention. In FIG. 6, the same reference numerals are given to the same components as those described in the first embodiment, and the redundant description will be appropriately omitted. In FIG. 6, the same hard macro 2 as in the first embodiment is used. It goes without saying that the same hard macro 2 as in the second embodiment can be used.

In the semiconductor chip 1" shown in FIG. 6, a relay hard macro 20 is provided between the hard macro 2A and the hard macro 2C. The relay hard macro 20 plays a role of relaying the reference clock CLK between the hard macros 2A and 2C. More specifically, the relay hard macro 20 has the relay input terminal R1, the relay output terminal R2 and a relay buffer 21. An input of the relay buffer 21 is connected to the relay input terminal R1, and an output thereof is connected to the relay output terminal R2. The relay buffer 21 outputs the reference clock CLK supplied from the relay input terminal R1 to the relay output terminal R2.

In the semiconductor chip 1", a power supply line and a ground line for the relay hard macro 20 is isolated from a power supply line and a ground line for another logic circuit, respectively. As a result, the reference clock CLK in the relay hard macro 20 is prevented from being affected by the noises on the power supply line and the ground line of the other logic circuit in the semiconductor chip 1".

In the semiconductor chip 1" shown in FIG. 6, the hard macro 2A, the relay hard macro 20 and the hard macro 2C are connected in series one after another though the relay interconnection 8. More specifically, the relay output terminal R2 of the hard macro 2A is connected to the relay input terminal R1 of the relay hard macro 20 through the relay interconnection 8. The relay output terminal R2 of the relay hard macro 20 is connected to the relay input terminal R1 of the hard macro 2C through the relay interconnection 8. Moreover, the clock input terminal IN (the external input buffer 4) of the hard macro 2A is connected to the clock pad PAD-CLK.

Operation

The semiconductor chip 1" having the above-mentioned configuration operates as follows. The reference clock CLK is supplied to the clock input terminal IN of the hard macro 2A through the clock pad PAD-CLK from the outside the semiconductor chip 1". The hard macro 2A outputs the reference clock CLK through the relay output terminal R2. The reference clock CLK output from the relay output terminal R2 of the hard macro 2A is relayed to the relay input terminal R1 of the relay hard macro 20 through the relay interconnection 8. The relay buffer 21 receives the reference clock CLK from the relay input terminal R1, and outputs the reference clock CLK to the relay output terminal R2. The reference clock CLK output from the relay output terminal R2 of the relay hard macro 20 is relayed to the relay input terminal R1 of the hard macro 2C through the relay interconnection 8.

As described above, according to the present embodiment, the reference clock CLK is relayed from the hard macro 2A to the hard macro 2C through the relay interconnection 8 and the relay hard macro 20.

Effect

A layout when the above-mentioned semiconductor chip 1" is mounted on a board is similar to the layout shown in FIG. 4. Therefore, according to the present embodiment, the same effects as in the first embodiment can be obtained. That is, it is possible to reduce the number of reference clock wirings 12 on the board even when the plurality of hard macros 2 are provided in one semiconductor chip 1". Thus, routing performance is improved, and interconnection capacity is reduced. Moreover, when the hard macro 2 as in the second embodiment is used, the effect as in the second embodiment can be obtained.

As an additional effect, the waveform of the reference clock CLK can be prevented from deterioration according to the present embodiment. The reason is that the relay buffer 21 (the relay hard macro 20) is provided on the relay interconnection 8 connecting between the hard macros 2. When the number of hard macros 2 installed in the chip is small, the length of the relay interconnection 8 tends to increase, and thus the waveform of the reference clock CLK tends to be rounded. In such a case, the relay hard macro 20 according to the present embodiment is particularly effective.

It is apparent that the present invention is not limited to the above embodiment, and that may be modified and changed without departing from the scope and spirit of the invention.

What is claimed is:

1. A semiconductor chip, comprising:
   a plurality of hard macros operating based on a reference clock; and
   a clock pad through which said reference clock is supplied from an outside to one of said plurality of hard macros,
   wherein said reference clock supplied to said one hard macro is relayed to other hard macros of the plurality of hard macros in order.

2. The semiconductor chip according to claim 1, further comprising a special interconnection used only for relaying said reference clock,
   wherein said plurality of hard macros are connected one after another through said special interconnection.

3. The semiconductor chip according to claim 1, wherein a power supply line and a ground line for said plurality of hard macros are isolated from a power supply line and a ground line for another logic circuit.

4. The semiconductor chip according to claim 3, wherein each of said plurality of hard macros includes a PLL circuit which multiplies said reference clock to generate a multiplied reference clock.

5. The semiconductor chip according to claim 4, wherein each of said plurality of hard macros comprises a SerDes (Serializer/Deserializer) macro.

6. The semiconductor chip according to claim 4, wherein each of said plurality of hard macros further includes:
an external input buffer configured to receive said reference clock supplied from outside the chip;
a relay input buffer configured to receive said reference clock relayed from another hard macro;
a relay output buffer configured to transfer said reference clock to still another hard macro; and
a selector configured to select any of said external input buffer and said relay input buffer as a selected input buffer and to output said reference clock received from said selected input buffer to said PLL circuit and said relay output buffer.

7. The semiconductor chip according to claim 6, wherein said plurality of hard macros include a first hard macro and a second macro,
wherein said external input buffer of said first hard macro is connected to said clock pad,
wherein said relay output buffer of said first hard macro is connected to said relay input buffer of said second hard macro,
wherein said selector of said first hard macro selects said external input buffer as said selected input buffer, and
wherein said selector of said second hard macro selects said relay input buffer as said selected input buffer.

8. The semiconductor chip according to claim 4, wherein each of said plurality of hard macros further includes:
an external input buffer configured to receive said reference clock supplied from outside the chip;
a first relay input buffer and a second relay input buffer configured to receive said reference clock relayed from another hard macro;
a first relay output buffer and a second relay output buffer configured to transfer said reference clock to still another hard macro; and
a selector configured to select any of said external input buffer, said first relay input buffer and said second relay input buffer as a selected input buffer and to output said reference clock received from said selected input buffer to said PLL circuit, said first relay output buffer and said second relay output buffer.

9. The semiconductor chip according to claim 8, wherein said first relay input buffer receives said reference clock from a first relay input terminal provided on a first side of said each hard macro,
wherein said first relay output buffer outputs said reference clock to a first relay output terminal provided on said first side,
wherein said second relay input buffer receives said reference clock from a second relay input terminal provided on a second side of said each hard macro, and
wherein said second relay output buffer outputs said reference clock to a second relay output terminal provided on said second side.

10. The semiconductor chip according to claim 9, wherein said first side and said second side face each other.

11. The semiconductor chip according to claim 9, wherein said plurality of hard macros include:
a first hard macro; and
a second hard macro arranged to be a mirror image of said first hard macro,
wherein said second relay output terminal of said first hard macro is connected to said second relay input terminal of said second hard macro,
wherein and said selector of said second hard macro selects said second relay input buffer as said selected input buffer.

12. The semiconductor chip according to claim 11, wherein said external input buffer of said first hard macro is connected to said clock pad, and
wherein said selector of said first hard macro selects said external input buffer as said selected input buffer.

13. The semiconductor chip according to claim 3, further comprising a relay macro having a buffer,
wherein said relay macro is provided between a first hard macro and a second hard macro of said plurality of hard macros,
wherein said buffer supplies said reference clock output from said first hard macro to said second hard macro, and
wherein a power supply line and a ground line for said relay macro is isolated from a power supply line and a ground line for another logic circuit.

14. A semiconductor integrated circuit device, comprising:
a semiconductor chip mounted on a board; and
a clock driver mounted on said board,
wherein said semiconductor chip includes:
a plurality of hard macros operating based on a reference clock; and
a clock pad connected to one of said plurality of hard macros,
wherein said clock driver supplies said reference clock to said clock pad of said semiconductor chip through one reference clock wiring, and
wherein said reference clock supplied to said one hard macro is relayed to other hard macros of the plurality of hard macros in order.

15. The semiconductor integrated circuit device according to claim 14,
wherein said semiconductor chip further includes a special interconnection used only for relaying said reference clock, and said plurality of hard macros are connected one after another through said special interconnection.

16. The semiconductor integrated circuit device according to claim 14, wherein, on said semiconductor chip, a power supply line and a ground line for said plurality of hard macros are isolated from a power supply line and a ground line for another logic circuit.

17. The semiconductor integrated circuit device according to claim 16, wherein each of said plurality of hard macros includes a PLL circuit which multiplies said reference clock to generate a multiplied reference clock.

18. The semiconductor integrated circuit device according to claim 17, wherein each of said plurality of hard macros comprises a SerDes (Serializer/Deserializer) macro.

* * * * *